United States Patent
Bock et al.

(10) Patent No.: US 7,420,228 B2
(45) Date of Patent: Sep. 2, 2008

(54) BIPOLAR TRANSISTOR COMPRISING CARBON-DOPED SEMICONDUCTOR

(75) Inventors: Josef Bock, Munich (DE); Thomas Meister, Taufkirchen (DE); Reinhard Stengl, Stadtbergen (DE); Herbert Schafer, Hohenkirchen-Siegertsbrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/246,420

(22) Filed: Oct. 7, 2005

(65) Prior Publication Data

US 2006/0040453 A1    Feb. 23, 2006

(51) Int. Cl.
*H01L 29/739* (2006.01)
(52) U.S. Cl. ............. 257/197; 257/163; 257/164; 257/165; 257/166; 257/378; 257/423; 257/477; 257/517; 257/526; 257/539; 257/565; 257/575; 257/E27.074; 257/E29.034; 257/E31.069
(58) Field of Classification Search ......... 257/163–166, 257/197, 378, 423, 477, 517, 526, 539, 565, 257/575, E27.074, E29.034, E31.069
See application file for complete search history.

(56) References Cited

U.S. PATENT DOCUMENTS

| | | | |
|---|---|---|---|
| 6,358,807 B1 | 3/2002 | Chyan et al. | |
| 6,465,870 B2 * | 10/2002 | Voldman | 257/565 |
| 6,534,371 B2 * | 3/2003 | Coolbaugh et al. | 438/312 |
| 6,878,976 B2 * | 4/2005 | Coolbaugh et al. | 257/183 |
| 2002/0003286 A1 | 1/2002 | Marty et al. | |
| 2002/0096742 A1 | 7/2002 | Voldman | |
| 2002/0121676 A1 | 9/2002 | Chu et al. | |
| 2002/0151153 A1 | 10/2002 | Drobny et al. | |

(Continued)

FOREIGN PATENT DOCUMENTS

DE    101 60 511    6/2003

(Continued)

OTHER PUBLICATIONS

Wiersma et al., "P-Type Carbon Doping of GaSb," *Journal of Electronic Materials*, vol. 30, No. 11, 2001, pp. 1429-1432.

(Continued)

*Primary Examiner*—Andy Huynh
(74) *Attorney, Agent, or Firm*—Jenkins, Wilson, Taylor & Hunt, P.A.

(57) ABSTRACT

A bipolar transistor comprising a collector region of a first conduction type, and a subcollector region of the first conduction type at a first side of the collector region. The transistor further includes a base region of the second conduction type provided at a second side of the collector region, and an emitter region of the first conduction type which is provided above the base region on the side remote from the collection region. A carbon-doped semiconductor region is provided on the first side alongside the collector region. The bipolar transistor is characterized in that the carbon-doped semiconductor region has a carbon concentration of $10^{19}$-$10^{21}$ cm$^{-3}$ and the base region has a smaller cross section than the collector region and the collector region has, in the overlap region with the base region, a region having an increased doping compared with the remaining region. The carbon-doped semiconductor region prevents an outdiffusion from the zone of the collector region into the remaining region of the collector region.

2 Claims, 4 Drawing Sheets

U.S. PATENT DOCUMENTS

2002/0177253 A1\* 11/2002 Johnson et al. .............. 438/91
2003/0042480 A1    3/2003 Hirose
2003/0082882 A1\*  5/2003 Babcock et al. ............ 438/309

FOREIGN PATENT DOCUMENTS

JP        2000 216168       8/2000

OTHER PUBLICATIONS

Lavéant et al., "Engineering the diffusion behavior of dopants (B. Sb) in silicon by incorporation of carbon," *Nuclear Instruments and Methods in Physics Research*, vol. B, No. 186, pp. 292-297, 2002.
Meister et al., "SiGe Base Bipolar Technology with 74 GHz $f_{max}$ and 11 ps Gate Delay," *IEDM Technical Digest*, pp. 739-741, 1995.
International Search Report dated Jul. 29, 2004 and International Preliminary Examination Report dated Jul. 29, 2005.
German Office Action dated Jan. 5, 2004.

\* cited by examiner

BIPOLAR TRANSISTOR COMPRISING CARBON-DOPED SEMICONDUCTOR

TECHNICAL FIELD

The present invention relates to a bipolar transistor, and particularly to a bipolar transistor comprising a carbon-doped semiconductor region.

BACKGROUND ART

Although applicable in principle to any desired bipolar transistors the present invention and the problem area on which it is based are explained with regard to DPSA transistors.

US 2002/0096742 discloses the introduction of a carbon-doped subcollector layer for reducing mechanical stresses and dislocations.

JP 2000-2162168 A discloses the introduction of a carbon-doped intermediate layer between collector and subcollector for the gettering of hydrogen that is implanted for the insulation of transistors.

DPSA (double polysilicon self-aligned) transistors are known e.g. from T. F. Meister et al., IEDM Technical Digest 1995, p. 739-741.

Their name stems from the fact that they use as $p^+$-type base terminal and as $n^+$-type emitter contact two $p^+$-type polysilicon and $n^+$-type polysilicon layers, respectively, which are deposited especially therefore. In this case, in the emitter window, the $n^+$-type polysilicon emitter layer is insulated from the $p^+$-type polysilicon layer of the base terminal in a self-aligned manner by means of a spacer. The DPSA transistor may contain both an implanted Si base and an epitaxially deposited SiGe base. The collector is usually connected via a buried layer that is buried in the substrate (also referred to as subcollector). On account of their lateral and vertical scalability and the low parasitic capacitance and resistance components the DPSA transistor structure is best suited to very high speed applications.

In order to make bipolar transistors suitable for ever higher frequencies, parasitic capacitances and resistances have to be reduced and charge carrier transit times have to be reduced. In the case of vertically constructed bipolar transistors, short transit times are achieved by means of very thin layers of emitter, base and collector.

A minimum diffusion of the dopants is crucial, because the layer thickness of the boron-doped base in the case of the npn transistor can only be chosen to be small enough that an outdiffusion of the boron into adjacent layers still does not entail any disadvantages. This is a central problem in the case of the npn bipolar transistor, because boron, besides the normal diffusion, additionally exhibits an accelerated diffusion induced by interstitial atoms.

Similar problems occur in the case of a phosphorus-doped collector, because phosphorus also has an accelerated diffusion through interstitial atoms which has the consequence that a doping profile present in the collector may be altered in an unintentional manner.

It is known that interstitial atoms arise e.g. as a result of oxidation and implantation. In particular, however, the deactivation of arsenic in highly doped layers (concentration of typically $10^{20}$ cm$^{-3}$), such as e.g. in a buried subcollector layer in the bipolar transistor, also represents a source of interstitial atoms. In this respect, see P. M. Rouseau et al., Appl. Phys. Lett. 65 (5), 1995, "Electrical deactivation of arsenic as a source of point defects". Since interstitial atoms are highly mobile in silicon, even more remote sources can induce an accelerated boron or phosphorus diffusion and thus make it impossible to miniaturize the transistor geometry further. Moreover, it is thus not practical to reduce the sheet resistance of the buried subcollector layer by means of a higher arsenic doping owing to the increase in disturbing interstitial atoms.

Reducing the concentration of the interstitial atoms is of crucial importance therefore for the further improvement of the high-frequency properties of bipolar transistors.

In principle, the concentration of the interstitial atoms can be reduced in two ways. Firstly, interstitial atoms can be prevented from arising through corresponding process control, and, secondly, interstitial atoms that have arisen can be annihilated again.

Interstitial atoms that have arisen are annihilated for example by using carbon-doped silicon layers which serve as a sink for interstitial atoms. This principle is successfully applied for example in the SiGe:C heterojunction bipolar transistor, as described e.g. in A. Gruhle et al., Appl. Phys. Lett. 75(5), 1999, "The reduction of base dopant outdiffusion in SiGe heterojunction bipolar transistors by carbon doping".

Carbon doping of this type may usually be employed in this case in the base and/or in the emitter and/or in the collector as described in WO 98/26457 and US-2002/0,121,676 A1.

What is disadvantageous about the known procedure is that protection against accelerated diffusion is not completely possible, and, although it is possible to increase the effectiveness by means of higher carbon concentrations, this entails a degradation of the transistor characteristic curves and reduced charge carrier mobilities.

In particular, it is not possible to prevent interstitial atoms from arising from a buried subcollector region highly doped with arsenic because many indispensable process steps take place in the corresponding temperature range of between 500° C. and 900° C.

The only solution that has remained hitherto, therefore, has been merely to reduce the arsenic concentration in the buried subcollector region, which entails a disadvantage in that the sheet resistance of the subcollector region is increased and, accordingly, the high-frequency suitability of the transistor is impaired.

SUMMARY

It is an object of the invention to specify an improved bipolar transistor in which lateral outdiffusion of the collector profile, e.g. phosphorus and vertical outdiffusion of the base profile e.g. boron, can be avoided and which has good electrical properties.

This object is achieved by means of a bipolar transistor according to claim 1.

The idea on which the present invention is based consists in the fact that the interstitial atoms are annihilated directly at their source either by an additional carbon-doped silicon layer being inserted between the subcollector and collector or by the subcollector itself being doped with carbon. It is thus possible, as it were, to form a barrier preferably in the entire connecting cross section.

The measure for annihilating the interstitial atoms directly in proximity to the place were they arise may be effected in addition to the already described carbon-doped layers for collector, emitter and base and further improve the protection against interstitial atoms.

A disadvantageous effect on the transistor characteristic curve is not to be expected, since the additional carbon-doped layer lies outside the space charge zone between collector and base. As a result, the arsenic concentration in the subcollector region can be increased further, and its sheet resistance can be reduced, without the need to accept disadvantages due to accelerated diffusion of dopants in the transistor.

The subclaims relate to preferred developments.

In accordance with one preferred development the carbon-doped semiconductor region is the entire subcollector region.

In accordance with a further preferred development the carbon-doped semiconductor region is a partial region of the subcollector region that is directly or indirectly adjacent to the collector region.

In accordance with a further preferred development the carbon-doped semiconductor region is an additional connecting layer between the collector region and the subcollector region.

In accordance with a further preferred development the first conduction type is the n-type and the second conduction type is the p-type and the subcollector region is arsenic-doped.

In accordance with a further preferred development the collector region is phosphorus-doped.

In accordance with a further preferred development at least one of the collector region, base region and emitter region is carbon-doped.

The invention is explained in more detail below on the basis of exemplary embodiments with reference to the drawings.

BRIEF DESCRIPTION OF THE DRAWINGS

In the figures.

In the figures, identical reference symbols designate identical or identically acting elements.

DETAILED DESCRIPTION

Figure 1:
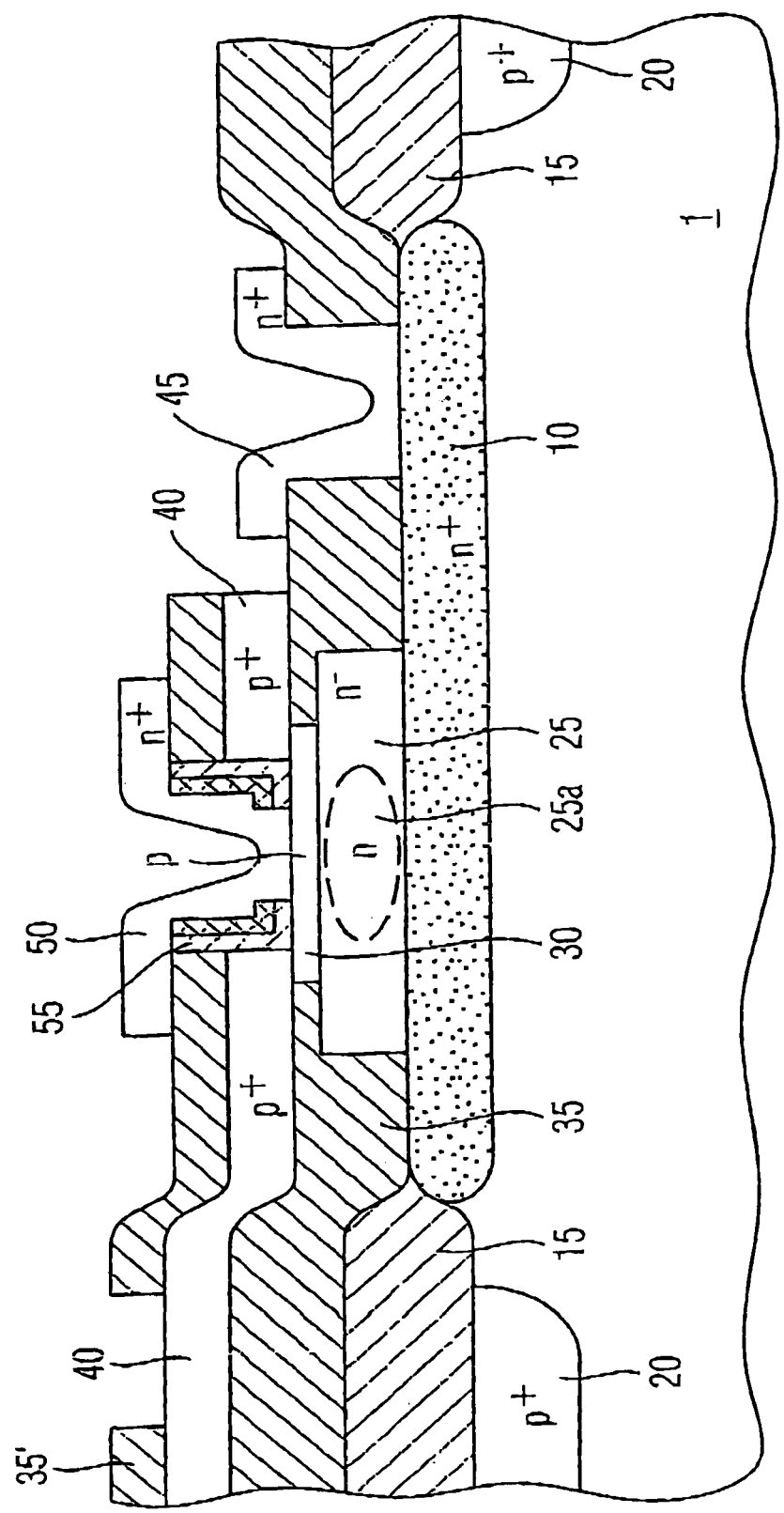
FIG. 1 shows a schematic illustration of a first embodiment according to the invention of a bipolar transistor.

FIG. 1 shows a schematic illustration of a first embodiment according to the invention of a bipolar transistor.

In FIG. 1, reference symbol 1 designates a silicon semiconductor substrate, 10 designates an arsenic-doped n$^+$-type subcollector region in the form of a layer buried in the substrate 1, 20 designates boron-doped p$^+$-type channel blocking regions, 25 designates a phosphorus-doped n$^-$-type collector region, 25a designates a phosphorus-doped n-type collector region, 30 designates a boron-doped p-type base region, 35 and 35 designate a respective CVD insulation oxide layer, 15 designates a LOCOS insulation oxide layer, 40 designates a p$^+$-type base terminal region, 45 designates an n$^+$-type collector contact, 55 designates a double spacer comprising silicon oxide/silicon nitride, and 50 designates a phosphorus-doped n$^+$-type emitter region.

The n-type collector region 25a is doped upward compared with the surrounding n$^-$-type collector region 25 by means of a self-aligned implantation of phosphorus through the emitter window, and has an approximately elliptical doping profile there (dashed line).

The n$^+$-type subcollector region 10 is completely doped upward with carbon (C), typical values of the C concentration lying in the range of $10^{19}$-$10^{21}$ cm$^{-3}$. The upward doping is preferably effected here by means of an implantation.

The undesirable outdiffusion from the n-type collector region 25a into the n$^-$-type collector region 25, which would lead to a lateral widening of the upwardly doped collector region 25a and thus to an increased base-collector capacitance, can be effectively prevented by means of the n$^+$-type subcollector region 10 that is completely upwardly doped with carbon (C). A vertical outdiffusion of the base profile, which would lead to a widening of the base and hence to longer transit times of the charge carriers is likewise prevented.

Figure 2:
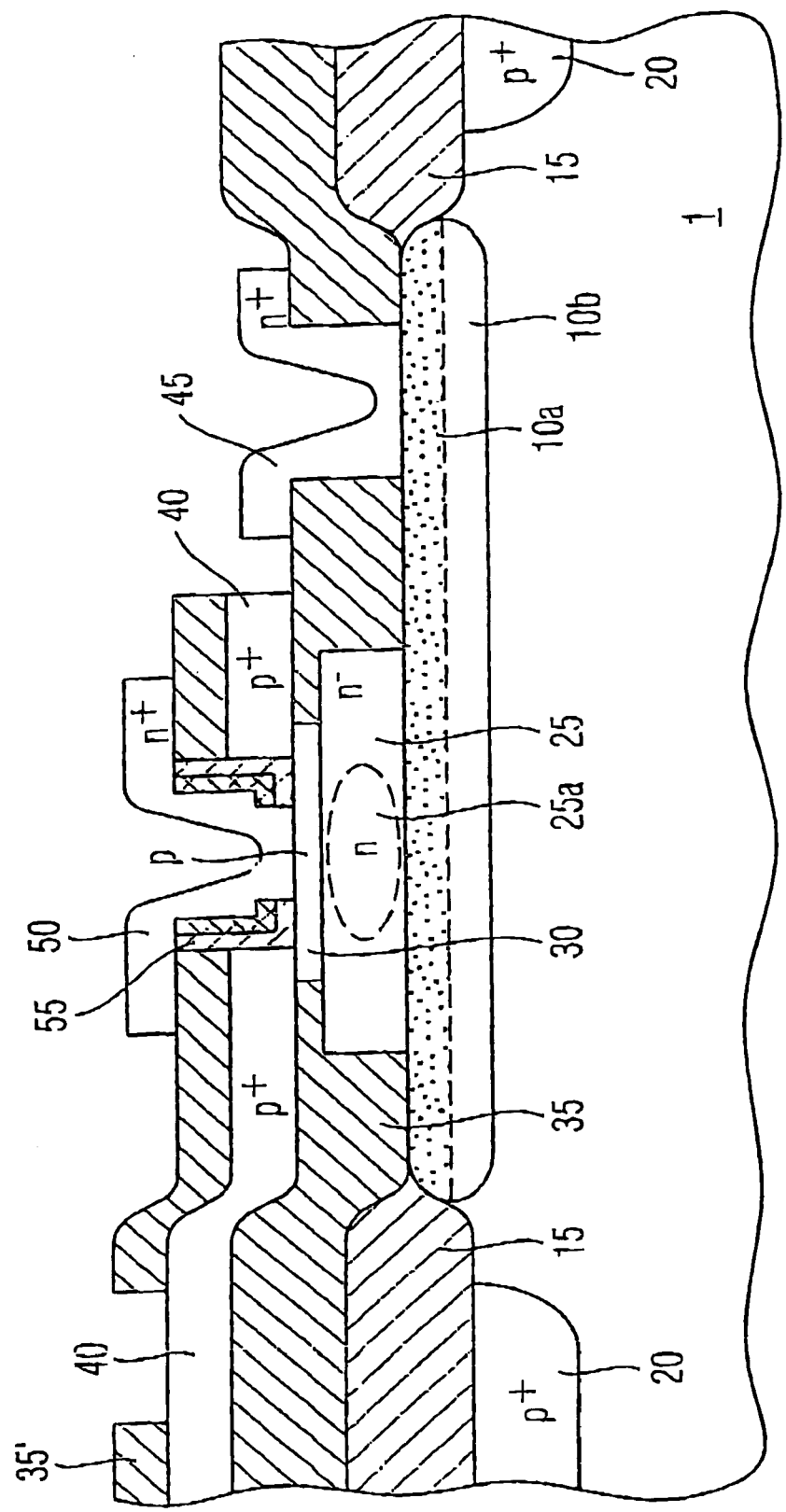
FIG. 2 shows a schematic illustration of a second embodiment according to the invention of a bipolar transistor.

FIG. 2 shows a schematic illustration of a second embodiment according to the invention of a bipolar transistor.

In the case of this second embodiment, in contrast to the first embodiment above, the carbon-doped semiconductor region is only a partial region 10a of the subcollector region 10a, 10b that is adjacent to the collector region 25, 25a. Here, too, the upward doping is preferably effected by means of an implantation.

The effect achieved is the same, however, as in the case of the first embodiment.

Figure 3:
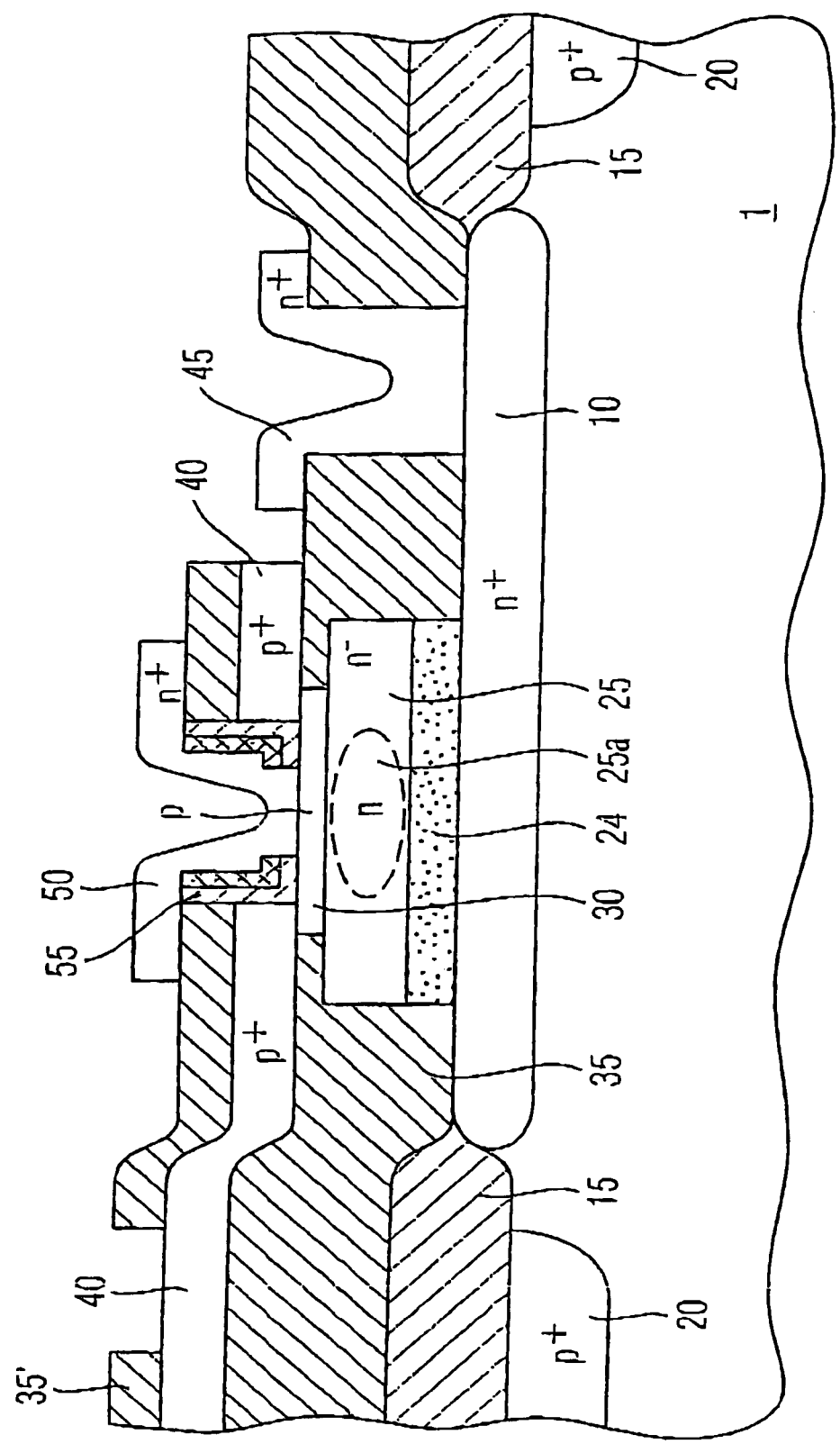
FIG. 3 shows a schematic illustration of a third embodiment according to the invention of a bipolar transistor.

FIG. 3 shows a schematic illustration of a third embodiment according to the invention of a bipolar transistor.

In the case of this third embodiment, in contrast to the first and second embodiments above, the carbon-doped semiconductor region the carbon-doped semiconductor region 24 is an additional collecting layer between the collector region 25, 25a and the subcollector region 10. The upward doping may be effected here by means of an implantation after the deposition of the layer 24 or in-situ during the deposition.

The effect achieved is the same, however, as in the case of the first and second embodiments.

Figure 4:
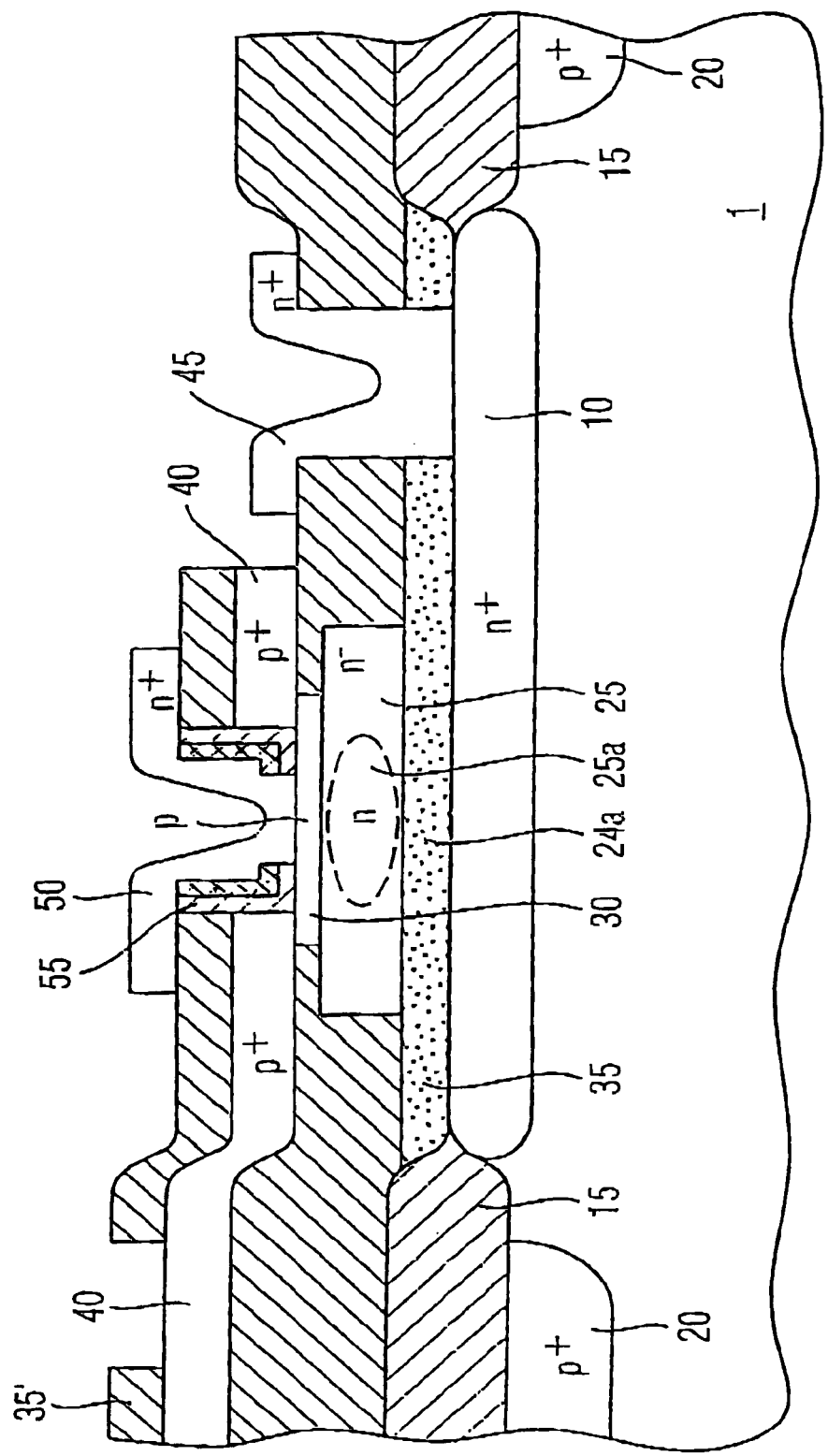
FIG. 4 shows a schematic illustration of a fourth embodiment according to the invention of a bipolar transistor.

FIG. 4 shows a schematic illustration of a fourth embodiment according to the invention of a bipolar transistor.

In the case of this fourth embodiment, in contrast to the third embodiment above, the carbon-doped semiconductor region 24a is not just provided at the interface to the collector region 25, 25a, but rather extends over the entire subcollector region 10 with the exception of the collector contact 45. Here, too, the upward doping may be effected by means of an implantation after the deposition of the layer 24a or in-situ during the deposition.

The effect achieved is the same, however, as in the case of the first, second and third embodiments.

The present invention is not restricted to the embodiments explained above, but rather can be employed in the same way in the case of homojunction and heterojunction bipolar transistors (in particular in the case of SiGe HBT), in the case of trench isolations, in the case of internal or external spacer concepts, etc. The layer thickness of the carbon-doped layer may vary between 20 nm in the case of a thin additional connecting layer and at approximately 1000 nm in the case of a continuously doped subcollector region.

LIST OF REFERENCE SYMBOLS

1 Silicon semiconductor substrate
10, 10b n$^+$-type subcollector region
20 p$^+$-type channel blocking regions
10a, 24, 24a Carbon-doped silicon region
25 n$^-$-type collector region
25a n-type collector region
30 p-type base region
35, 35' CVD Insulation oxide layers
15 LOCOS Insulation oxide layer
40 p$^+$-type base terminal region
45 n$^+$-type collector contact
55 Double spacer comprising silicon oxide/silicon nitride
50 n$^+$-type emitter region

The invention claimed is:
1. A bipolar transistor comprising:
a collector region of a first conduction type;
a subcollector region of the first conduction type, which is electrically connected to the collector region at a first side of the collector region;
a base region of the second conduction type which is provided at a second side of the collector region, the base region having a smaller cross section than the collector region;
an emitter region of the first conduction type, which is provided above the base region on the side remote from the collector region; and
a carbon-doped semiconductor region, which is provided on the first side alongside the collector region, the carbon-doped semiconductor region having a carbon concentration of $10^{19}$-$10^{21}$ cm$^{-3}$;
wherein the collector region has, in the overlap region with the base region, a zone having an increased doping of the first conduction type compared with the remaining region; and the carbon-doped semiconductor region laterally extends alongside the zone and the remaining region of the collector region, and prevents a lateral outdiffusion from the zone into the remaining region of the collector region.

2. The bipolar transistor as claimed in claim 1, wherein the carbon-doped semiconductor region is an entire subcollector region.

* * * * *

UNITED STATES PATENT AND TRADEMARK OFFICE
CERTIFICATE OF CORRECTION

| | |
|---|---|
| PATENT NO. | : 7,420,228 B2 |
| APPLICATION NO. | : 11/246420 |
| DATED | : September 2, 2008 |
| INVENTOR(S) | : Bock et al. |

It is certified that error appears in the above-identified patent and that said Letters Patent is hereby corrected as shown below:

On title page, item 63 - Please insert:

--(63) Related U.S. Application Data

Continuation of application No. PCT/EP04/03124, filed on March 24, 2004--

And

On title page, item 30 - Please insert:

--(30) Foreign Application Priority Data

April 10, 2003      (DE) ………………………….. 10 316 531.2--

Signed and Sealed this

Fourth Day of November, 2008

JON W. DUDAS
*Director of the United States Patent and Trademark Office*